(12) United States Patent
Somashekar et al.

(10) Patent No.: US 10,713,408 B2
(45) Date of Patent: *Jul. 14, 2020

(54) AWARE VARIABLE FILL PATTERN GENERATOR

(71) Applicant: TEXAS INSTRUMENTS INCORPORATED, Dallas, TX (US)

(72) Inventors: Sumanth Somashekar, Dallas, TX (US); Shaibal Barua, Allen, TX (US); Padman Sooryamoorthy, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/264,719

(22) Filed: Feb. 1, 2019

(65) Prior Publication Data

US 2019/0163859 A1     May 30, 2019

Related U.S. Application Data

(63) Continuation of application No. 15/949,460, filed on Apr. 10, 2018, now Pat. No. 10,210,300, which is a continuation of application No. 14/934,130, filed on Nov. 5, 2015, now Pat. No. 9,953,123.

(51) Int. Cl.
| | |
|---|---|
| *G06F 30/392* | (2020.01) |
| *G03F 1/70* | (2012.01) |
| *G03F 1/76* | (2012.01) |
| *H01L 23/522* | (2006.01) |
| *H01L 23/532* | (2006.01) |

(52) U.S. Cl.
CPC .............. *G06F 30/392* (2020.01); *G03F 1/70* (2013.01); *G03F 1/76* (2013.01); *H01L 23/522* (2013.01); *H01L 23/53228* (2013.01)

(58) Field of Classification Search
CPC ............ G06F 17/5068; G06F 17/5072; G06F 17/5081; G06F 30/392; G03F 1/70; G03F 1/76; H01L 23/522; H01L 23/53228
USPC .................................................. 716/55, 110
See application file for complete search history.

(56) References Cited

U.S. PATENT DOCUMENTS

| | | | |
|---|---|---|---|
| 9,218,446 B1 * | 12/2015 | Bashaboina | ........ G06F 17/5072 |
| 2010/0041232 A1 | 2/2010 | Summerfelt et al. | |
| 2011/0072401 A1 | 3/2011 | Elkader et al. | |

\* cited by examiner

*Primary Examiner* — Paul Dinh
(74) *Attorney, Agent, or Firm* — Andrew R. Ralston; Charles A. Brill; Frank D. Cimino (57) ABSTRACT

A layout file for an integrated circuit has drawn geometries. Variable fill geometries are added to local areas based on densities of the drawn geometries in windows associated with the local areas and on the global density of all the drawn geometries in the layout file. Each window has a separate local area associated with it. The densities of the variable fill geometries in the local areas are not all equal. Densities of the fill geometries are higher in local areas associated with windows having lower densities of the drawn geometries, and for lower values of the global density. The layout file is stored in a computer-readable medium which may be used to produce a photomask for manufacturing an integrated circuit.

20 Claims, 8 Drawing Sheets

AWARE VARIABLE FILL PATTERN GENERATOR

CROSS REFERENCE TO RELATED APPLICATIONS

Under 35 U.S.C. § 120, this continuation application claims benefits of and priority to U.S. patent application Ser. No. 15/949,460, filed Apr. 10, 2018 and issued as U.S. Pat. No. 10,210,300, and to U.S. patent application Ser. No. 14/934,130, filed on Nov. 5, 2015 and issued as U.S. Pat. No. 9,953,123, the entireties of which are hereby incorporated herein by reference.

FIELD

This disclosure relates to the field of integrated circuits. More particularly, this disclosure relates to pattern fill structures in integrated circuits.

BACKGROUND

Integrated circuits contain several physical layers of circuit structures. The physical layers may include, for example, a layer of metal interconnects formed by a copper damascene process, which uses a copper chemical mechanical polish (CMP) process. The circuit structures include the metal interconnects which provide electrical connections between components of the integrated circuit. In other examples, the physical layers may include an active area layer laterally surrounded by a layer of field oxide formed by a shallow trench isolation (STI) process which uses an oxide CMP process, a layer of gates for metal oxide semiconductor (MOS) transistors formed by a polycrystalline silicon reactive ion etch (RIE) process, or a layer of metal interconnects formed by an aluminum ME process. The physical layers are formed using etch masks on the integrated circuit, which are patterned using photolithographic processes. CMP processes, ME processes, photolithographic processes, and other fabrication processes, have higher process latitude when the physical layer has increased uniformity across the integrated circuit. Functional structures are understood to be structures of the physical layers which are included in the functional design of the integrated circuit and may be related to operation of the integrated circuit. Other structures of the physical layers may include alignment marks, die marks, and test structures.

The process masks to form the physical layers are formed using photomasks which have mask elements corresponding to the structures of the physical layers. The photomasks are formed using layout files which include geometries corresponding to the mask elements of the photomasks. It is common to add fill geometries for fill structures to the layout files for making photomasks used in fabricating the integrated circuits. Fill geometries are sometimes referred to as fill pattern, dummy geometries or dummy pattern. The fill structures are not directly electrically connected to components of the integrated circuit. The fill geometries are added to improve pattern uniformity. Attaining uniform densities among various devices fabricated using a common process sequence has been problematic, thus undesirably reducing process latitude for the relevant operations.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit is formed by computing local densities of drawn geometries of a layout file for a physical layer of the integrated circuit in windows in an area for the integrated circuit, generating a pluralities of variable fill geometries for the layout file in local areas associated with the windows, so that the variable fill geometries do not have the same density in every local area, and storing the layout file in a computer-readable medium. Densities of the fill geometries are higher in local areas associated with windows having lower densities of the drawn geometries.

DETAILED DESCRIPTION OF EXAMPLE EMBODIMENTS

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosed material can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A layout file, such as a Graphic Database System II (GDSII) file or Open Artwork System Interchange Standard (OASIS) file, for an integrated circuit includes circuit geometries for a physical layer of an integrated circuit. The layout file may include other geometries for the physical layer, such as alignment marks, die marks, and test structures. The circuit geometries, alignment marks, die marks, and test structures and other geometries are referred to as drawn geometries, even though these geometries may be generated by a computer program rather than being drawn manually. A global density of the drawn geometries for the physical layer is computed; the global density is an area of the drawn geometries for the physical layer, at a 1:1 scale with the integrated circuit, divided by an area of the integrated circuit. Some layout files may scale the geometries to account for a magnification factor, such as 4 or 5, in a photomask formed using the layout file. Other layout files may scale the geometries by other factors. For the purposes of this disclosure, scaling is ignored and all dimensional relationships are expressed in units at a 1:1 scale with the integrated circuit. The global density is less than a target density for the physical layer.

A plurality of windows and corresponding local areas are defined in the area for the integrated circuit. Each window at least partially overlaps the corresponding local area. In one example, the windows may be larger than, and completely overlap, the corresponding local areas. In another example, the windows may be a same size as, and coincident with, the corresponding local areas. In one example, the plurality of local areas may be defined to completely cover the area for the integrated circuit. In another example, the local areas may be defined in certain portions of the integrated circuit and not in other portions. In each window, a local density of the drawn geometries for the physical layer is computed; the local density is defined as an area of the drawn geometries within the window divided by an area of the window. Variable fill geometries may be added to the layout file in a fill portion of the local area. A fill density of the variable fill geometries is dependent on the global density, the local density and the target density. The fill density, which is an area of the variable fill geometries in the fill portion of the local area, divided by an area of the fill portion, increases as a difference between the global density and the target density increases, and as a difference between the local density and the target density increases, when the local density is less than the target density. The fill density varies among the local areas. The variable fill geometries may be selected from a finite set of patterns, or may be selected from a continuous distribution of patterns.

The physical layer in the integrated circuit is formed using the layout file with the variable fill geometries. In one example, a Manufacturing Electron Beam Exposure System (MEBES) file is generated using the layout file. A photomask for the physical layer may be formed using the MEBES file. The photomask includes mask elements for the drawn geometries and the variable fill geometries. The photomask is used in a photolithographic process to form a process mask on the integrated circuit for the physical layer. In another example, the process mask may be formed using a maskless photolithographic using the layout file, possibly through an intermediate file such as a MEBES file. The physical layer in the integrated circuit includes fill structures corresponding to the variable fill geometries added to the layout file.

Adding the variable fill geometries to the layout file as described herein may provide physical layers of integrated circuit with global densities closer to the target density compared to other methods of adding fill geometries. Fabrication processes have higher process latitude when the global density of the physical layer is closer to the target density. The disclosed method may thus advantageously provide increased process latitude for a plurality of different integrated circuit designs.

Figure 1:
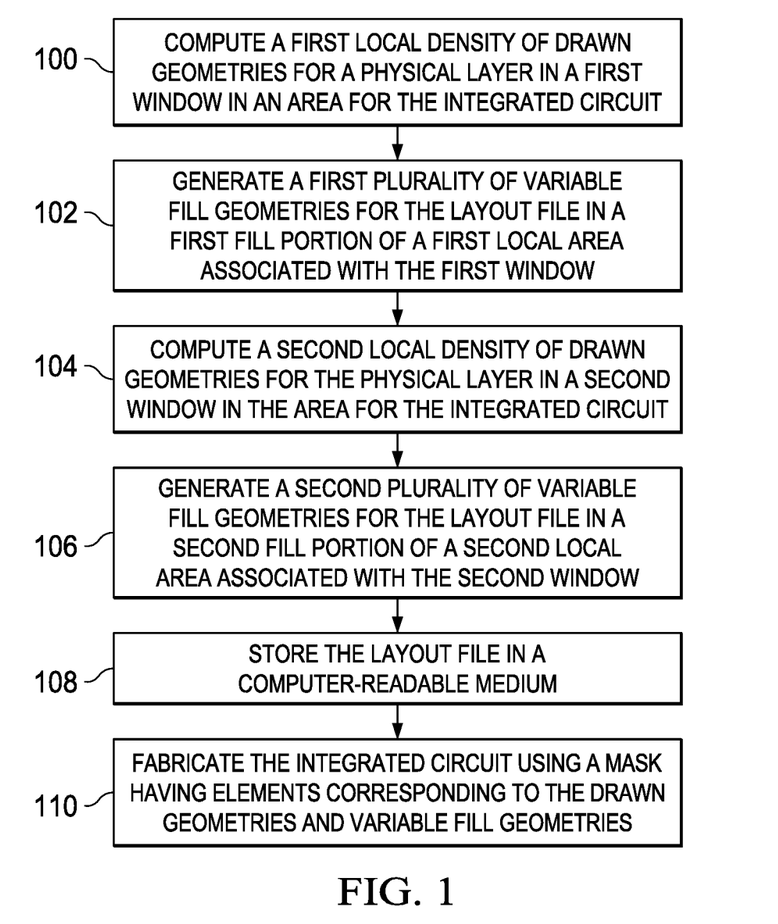
FIG. 1 is a flowchart of an example method of forming an integrated circuit.

FIG. 1 is a flowchart of an example method of forming an integrated circuit. The method begins with step 100, which is to compute a first local density of drawn geometries of a layout file for a physical layer of the integrated circuit, in a first window of a plurality of windows in an area for the integrated circuit. The drawn geometries include circuit geometries, alignment marks, die marks, and test structures. The first window may have lateral dimensions of, for example, 50 microns to 1000 microns, and may have a square shape, a round shape, a rectangular shape, or other shape. The windows may each be a same size and/or shape, or the windows may have different sizes and/or shapes depending on a location in the integrated circuit or a type of underlying circuitry. For example, the windows may be larger over logic circuitry than over linear circuitry. Adjacent windows may abut each other or may partially overlap. In one version of the instant example, the plurality of windows may cover the area for the integrated circuit. In another version, the windows may not cover some portions of the area for the integrated circuit, such as memory cells or a periphery of the integrated circuit. To compute the first local density, an area of the drawn geometries within the first window, that is, a sum of the areas of those portions of the drawn geometries within the boundaries of the first window, is obtained. Overlapping portions of separate drawn geometries are not double counted, so that the sum of the areas of the drawn geometries in the first window corresponds to an area of elements of the physical layer in the first window. The sum of the areas of the drawn geometries in the first window is divided by an area of the first window to obtain the first local density.

The method continues with step 102, which is to generate a first plurality of variable fill geometries for the layout file in a first fill portion of a first local area associated with the first window. The first local area is one local area of a plurality of local areas; each local area is associated with a corresponding window of the plurality of windows. In one version of the instant example, the first local area may be smaller than, and be completely overlapped by, the first window. In another version, the first local area may be a same size as, and coincident with, the first window. In one version of the instant example, adjacent local areas may abut. In another version, adjacent local areas may be separated by a space. The first local area may have lateral dimensions of, for example, 50 microns to 1000 microns, and may have a square shape, a round shape, a rectangular shape, or other shape. The first fill portion of the first local area is a portion of the first local area which is free of drawn geometries and is available for fill patterns, compatible with design rules for the integrated circuit.

The geometries of the first plurality of variable fill geometries are selected to have a first fill density which is a function of the first local density, a global density for the physical layer of the integrated circuit, and a target density for the physical layer. The first fill density is an area of the first plurality of variable fill geometries, that is, a first fill structure area, divided by an area of the first fill portion. The global density for the physical layer of the integrated circuit is an area of the drawn geometries for the physical layer divided by an area of the integrated circuit. The target density is determined by capabilities of the process operations used to form the physical layer. For example, a target density for a copper damascene process may be 45 percent. The first local density and the global density are both lower than the target density. Variable fill geometries with higher fill densities are selected for instances in which the global density is lower and the first local density is lower. In one example, the target density may be 45 percent, the global density may be 33 percent, and the first local density may be 33 percent, in which case variable fill geometries with a fill density of 23 percent to 27 percent may be added to the first fill portion. In another example, the target density may be 45 percent, the global density may be 33 percent, and the first local density may be 42 percent, in which case variable fill geometries with a fill density of 13 percent to 17 percent may be added to the first fill portion. In further example, the target density may be 45 percent, the global density may be 38 percent, and the first local density may be 35 percent, in which case variable fill geometries with a fill density of 18 percent to 22 percent may be added to the first fill portion. The variable fill geometries may be selected from a plurality of configurations, each having a different fill density, by using a lookup table which has selection choices based on pluralities of ranges for the target density, the global density and the first local density. The first plurality of variable fill geometries is added to the layout file in the first fill portion of the first local area.

The method continues with step 104 which is to compute a second local density of the drawn geometries of the layout file, in a second window of the plurality of windows. The second window may have a same size and shape as the first window, or may have a different size and/or shape. The second local density is computed similarly to the first local density: areas of portions of the drawn geometries within the boundaries of the second window are summed without double counting, and the sum of the areas of the drawn geometries in the second window is divided by an area of the second window to obtain the second local density. In the instant example, the second local density is less than the first local density.

The method continues with step 106, which is to generate a second plurality of variable fill geometries for the layout file in a second fill portion of a second local area associated with the second window. The second local area is another local area of the plurality of local areas. The second local area may be smaller than, and be completely overlapped by, the second window, or may be a same size as, and coincident with, the second window, independently of the relationship between the first window and the first local area. The second window may have lateral dimensions of, for example, 50 microns to 1000 microns, and may have a square shape, a round shape, a rectangular shape, or other shape. The second fill portion of the second local area is a portion of the second local area which is free of drawn geometries and is available for fill patterns compatible with design rules for the integrated circuit.

The geometries of the second plurality of variable fill geometries are selected to have a second fill density which is a function of the second local density, the global density, and the target density. The second fill density is an area of the second plurality of variable fill geometries, that is, a second fill structure area, divided by an area of the second fill portion. The relationship between the second fill density and the second local density, the global density, and the target density is as described for the first fill density in reference to step 102. In the instant example, the second fill density is greater than the first fill density. The second plurality of variable fill geometries is added to the layout file in the second fill portion of the second local area.

The method continues with step 108 which is to store the layout file with the added variable fill geometries, including the first plurality of variable fill geometries and the second plurality of variable fill geometries, in a computer-readable medium. The computer-readable medium may be, for example, a magnetic hard disk, an optical memory disk such as a CD-ROM, a magnetic tape, a flash memory, a dynamic random access memory (DRAM), or a static random access memory (SRAM).

After step 108 is completed, the stored layout file from step 108 may subsequently be read by a computer, a photomask generating tool, or a semiconductor processing tool. In one version of the instant example, the stored layout file from step 108 be read by a computer, and the computer may generate a MEBES file using the information from the layout file, including the added variable fill geometries. The MEBES file may be subsequently used to form a photomask for the physical layer, so that the photomask contains mask elements corresponding to the added variable fill geometries. The photomask may be used to form a process mask, such as an etch mask, for the physical layer on the integrated circuit by a photolithographic process. In another version of the instant example, the stored layout file from step 108 be read by a computer, and the computer may generate a MEBES file, which may be used in a direct-write lithography tool such as an electron beam lithography tool, to form a process mask for the physical layer on the integrated circuit.

The method continues with step 110, which is to fabricate the integrated circuit using the process mask formed with the layout file with the added variable fill geometries. The process mask includes elements corresponding to the added variable fill geometries. The process mask may be used for an etch process in forming the integrated circuit, and may be removed after the etch process is completed. For some physical layers, for example copper damascene interconnects or STI field oxide, the etch process may form trenches which are subsequently filled by copper or silicon dioxide, respectively. Excess copper or silicon dioxide is removed by a CMP process. Forming the process mask with the elements corresponding to the variable fill geometries may provide a more uniform pattern to be polished which is closer to a target density, advantageously improving latitude for the CMP process, resulting in more uniform removal of the copper or silicon dioxide across the integrated circuit. For other physical layers, a layer of material, such as polycrystalline silicon or aluminum, may be formed on the integrated circuit and the process mask formed over the layer of material. The etch process removes material exposed by the process mask, leaving the physical layer under the mask. Forming the process mask with the elements corresponding to the variable fill geometries may provide a more uniform pattern to be etched which is closer to a target density, advantageously improving latitude for the etch process, resulting in more uniform undercut and overetch of the layer of material across the integrated circuit. Alternately, the process mask may be used for an ion implant process, and may be removed after the implant process is completed. Forming the process mask with the elements corresponding to the added variable fill geometries may provide a more uniform pattern for the process mask to be formed which is closer to a target density, advantageously improving latitude for the photolithographic or direct-write lithographic process, resulting in more accurate dimensions of the process mask across the integrated circuit.

Figure 2:
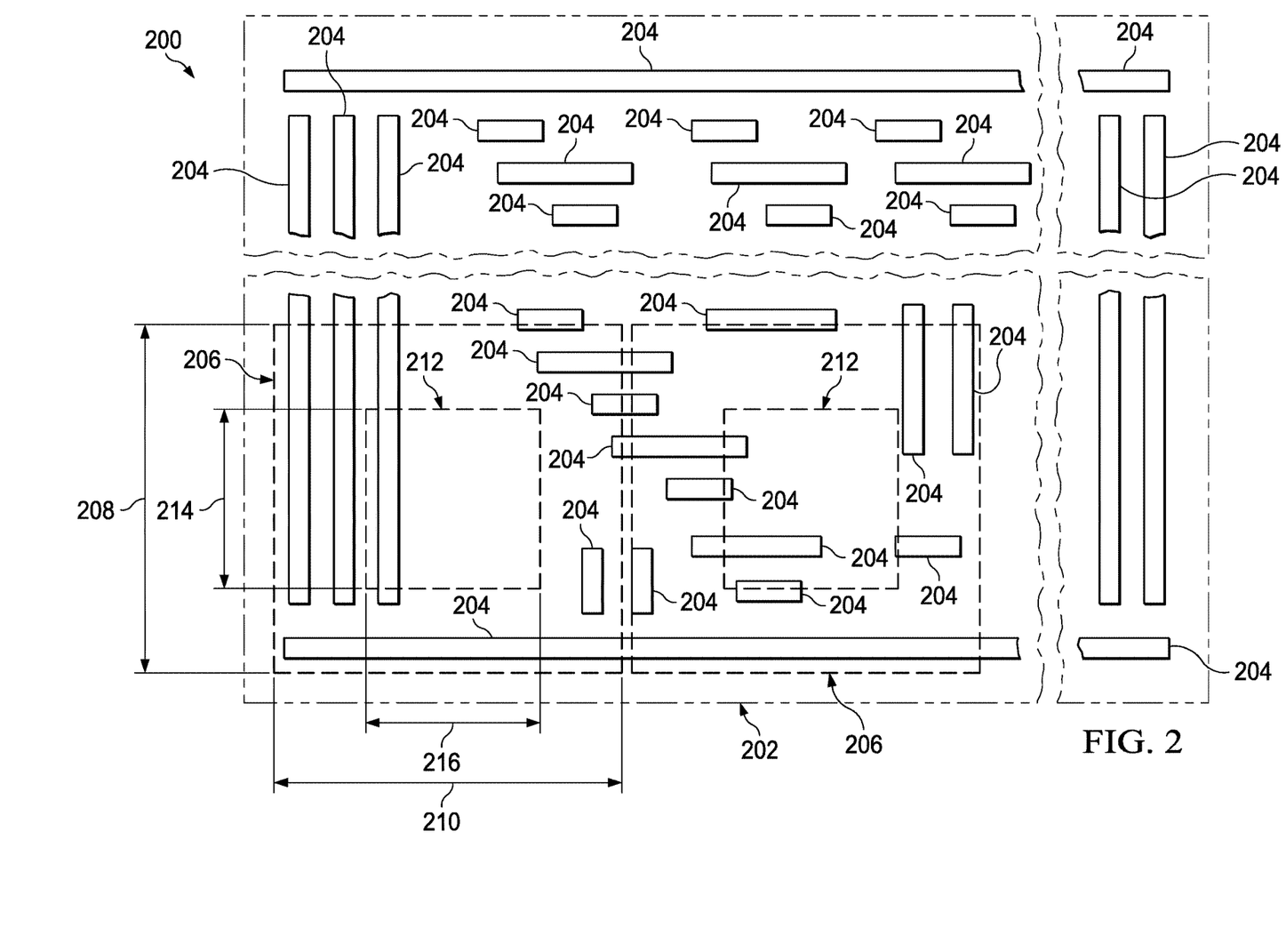
FIG. 2 is a depiction of a layout file, showing an example arrangement of windows and local areas.

FIG. 2 is a depiction of a layout file, showing an example arrangement of windows and local areas. The layout file 200 for an integrated circuit, indicated schematically in FIG. 2 by a boundary around an area 202 for the integrated circuit, includes drawn geometries 204 for a physical layer of an integrated circuit. The drawn geometries 204 may be, for example, for metal interconnects formed by a copper damascene process. A plurality of windows 206 is defined in the area 202 covered by the layout file 200. The windows 206 may have square or rectangular shapes, as depicted in FIG. 2, or may have other shapes such as rounded shapes. The windows 206 may have widths 208 and lengths 210 of 50 microns to 1000 microns. Adjacent windows 206 may be defined to abut each other without overlapping, as indicated in FIG. 2, or may be defined so as to overlap each other. Alternatively, adjacent windows 206 may be separated by a space. The windows 206 may be defined over all of the area 202 for the integrated circuit, or may be defined over a portion of the area 202. For example, a portion of the area 202 for memory cells or logic gates may be free of the windows 206. The windows 206 may be equal in size and shape, or may vary in size and/or shape across the area 202 for the integrated circuit.

A plurality of local areas 212 are defined, a separate local area 212 for each window 206. The local areas 212 may be smaller than the associated windows 206 as depicted in FIG. 2, or may be substantially the same size. The local areas 212 may have widths 214 and lengths 216 of 50 microns to 1000 microns. In one version of the instant example, adjacent local areas 212 may abut each other without overlapping. The local areas 212 may be equal in size and shape, or may vary in size and/or shape across the area 202 for the integrated circuit. The drawn geometries 204 may extend into the local areas 212, as shown in FIG. 2.

Figure 3:
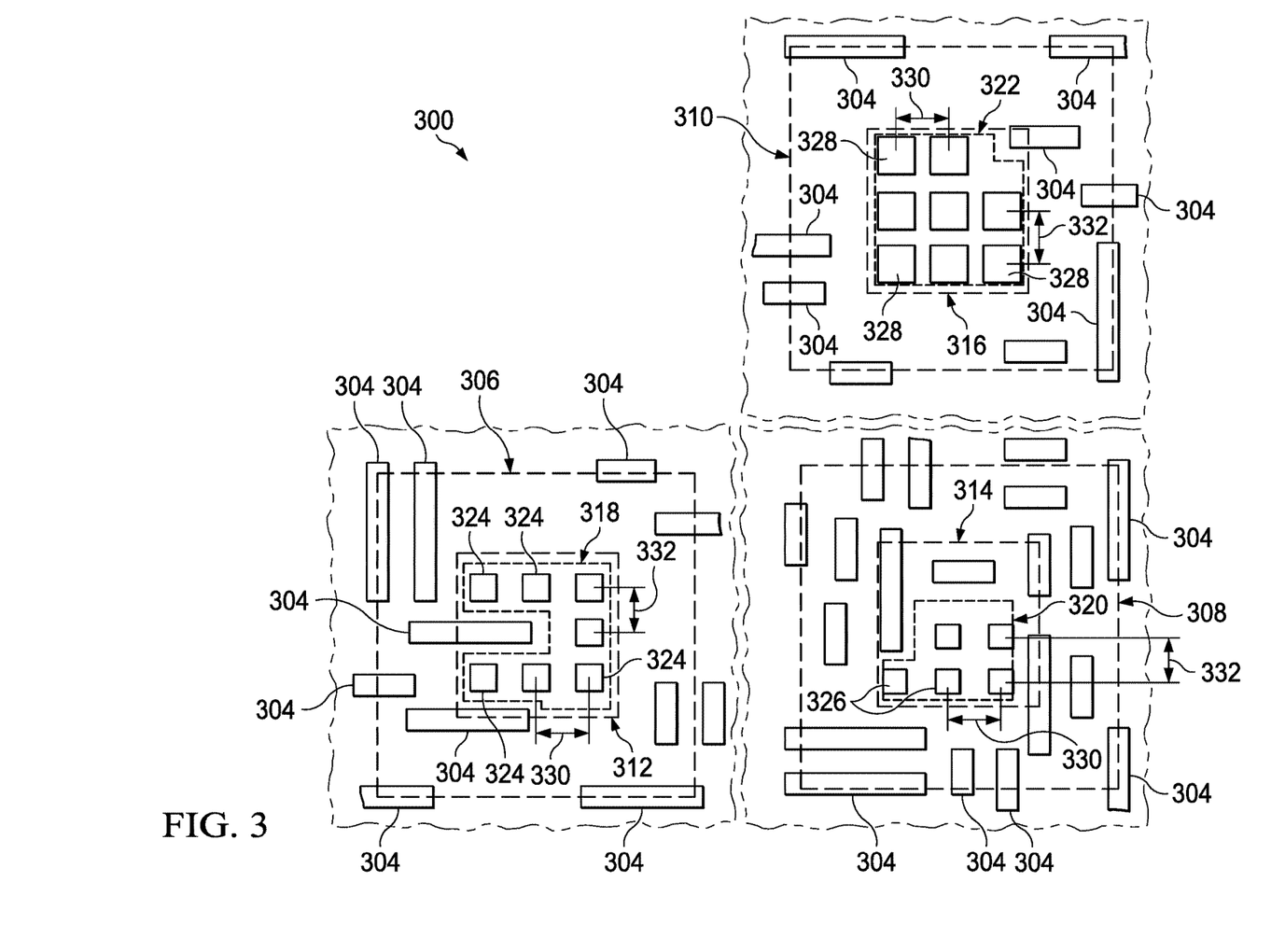
FIG. 3 is a depiction of a layout file, showing an example of variable fill geometries.

FIG. 3 is a depiction of a layout file, showing an example of variable fill geometries. The layout file 300 for an integrated circuit includes drawn geometries 304 for a physical layer of an integrated circuit. A plurality of windows, including a first window 306, a second window 308 and a third window 310 are defined in the area covered by the layout file 300, for example as described in reference to FIG. 2. A plurality of local areas are defined, with a separate local area for each window, including a first local area 312 associated with the first window 306, a second local area 314 associated with the second window 308 and a third local area 316 associated with the third window 310. The local areas may be defined as described in reference to FIG. 2. The drawn geometries 304 may extend into the local areas.

A global density for the physical layer of the integrated circuit is computed by dividing the areas of the drawn geometries 304 by an area of the integrated circuit. The global density is less than a target density. A plurality of local densities, one for each window, is computed by dividing the areas of the drawn geometries within the window by an area of the window. The plurality of local densities includes a first local density which is the areas of the drawn geometries 304 within the first window 306, a second local density which is the areas of the drawn geometries 304 within the second window 308, and a third local density which is the areas of the drawn geometries 304 within the third window 310. In the instant example, the second local density is greater than the first local density which is greater than the third local density.

A fill portion is defined in each of at least a portion of the local areas, including a first fill portion 318 in the first local area 312, a second fill portion 320 in the second local area 314 and a third fill portion 322 in the third local area 316. Each fill portion is defined as a portion of the corresponding local area that is free of the drawn geometries 304 and separated from the drawn geometries 304 by a desired space. The desired space may be related to design rules for the physical layer of the integrated circuit. In some instances of the local areas, possibly no portion of the local area may meet the criteria for the fill portion, so that those local areas are free of fill portions.

A plurality of variable fill geometries are defined in the fill portions of the local areas, including a first plurality of variable fill geometries 324 in the first fill portion 318, a second plurality of variable fill geometries 326 in the second fill portion 320, and a third plurality of variable fill geometries 328 in the third fill portion 322. The geometries of the first plurality of variable fill geometries 324 are selected to have a first fill density which is a function of the first local density, the global density, and the target density. Analogously, the geometries of the second plurality of variable fill geometries 326 are selected to have a second fill density which is similar function of the second local density, the global density, and the target density, and the geometries of the third plurality of variable fill geometries 328 are selected to have a third fill density which is similar function of the third local density, the global density, and the target density. Variable fill geometries with higher fill densities are selected for instances in which the global density is lower and the local density is lower. In the instant example, the third fill density of the third plurality of variable fill geometries 328 is higher than the first fill density of the first plurality of variable fill geometries 324, which is higher than the second fill density of the second plurality of variable fill geometries 326.

In the instant example, the first plurality of variable fill geometries 324, the second plurality of variable fill geometries 326 and the third plurality of variable fill geometries 328 are defined to have a common horizontal pitch distance 330 and a common vertical pitch distance 332. The horizontal pitch distance 330 is a horizontal distance 330 between centers of adjacent fill geometries of the first plurality of variable fill geometries 324, the second plurality of variable fill geometries 326 and the third plurality of variable fill geometries 328. In the instant example, the individual geometries of the first plurality of variable fill geometries 324 have equal sizes to each other, the individual geometries of the second plurality of variable fill geometries 326 have equal sizes to each other, and the individual geometries of the third plurality of variable fill geometries 328 have equal sizes to each other. The size of the individual geometries of the third plurality of variable fill geometries 328 is larger than the size of the individual geometries of the first plurality of variable fill geometries 324, which is larger than the size of the individual geometries of the second plurality of variable fill geometries 326, thus providing the relationship between the third fill density, the second fill density and the first fill density described above for the instant example. The variable fill geometries, including the first plurality of variable fill geometries 324, the second plurality of variable fill geometries 326 and the third plurality of variable fill geometries 328, are added to the layout file 300.

Other configurations for the first plurality of variable fill geometries 324, the second plurality of variable fill geometries 326 and the third plurality of variable fill geometries 328 which provide the relationship between the third fill density, the second fill density and the first fill density described above are within the scope of the instant example. In another version of the instant example, the individual geometries of the first plurality of variable fill geometries 324, the second plurality of variable fill geometries 326 and the third plurality of variable fill geometries 328 may have a common size, with varying horizontal 330 and vertical 332 pitch distances. In one version of the instant example, the first fill portion 318 may be free of any other fill geometries which have a different size from the first plurality of variable fill geometries 324, the second fill portion 320 may be free of any other fill geometries which have a different size from the second plurality of variable fill geometries 326, and the third fill portion 322 may be free of any other fill geometries which have a different size from the third plurality of variable fill geometries 328.

Figure 4:
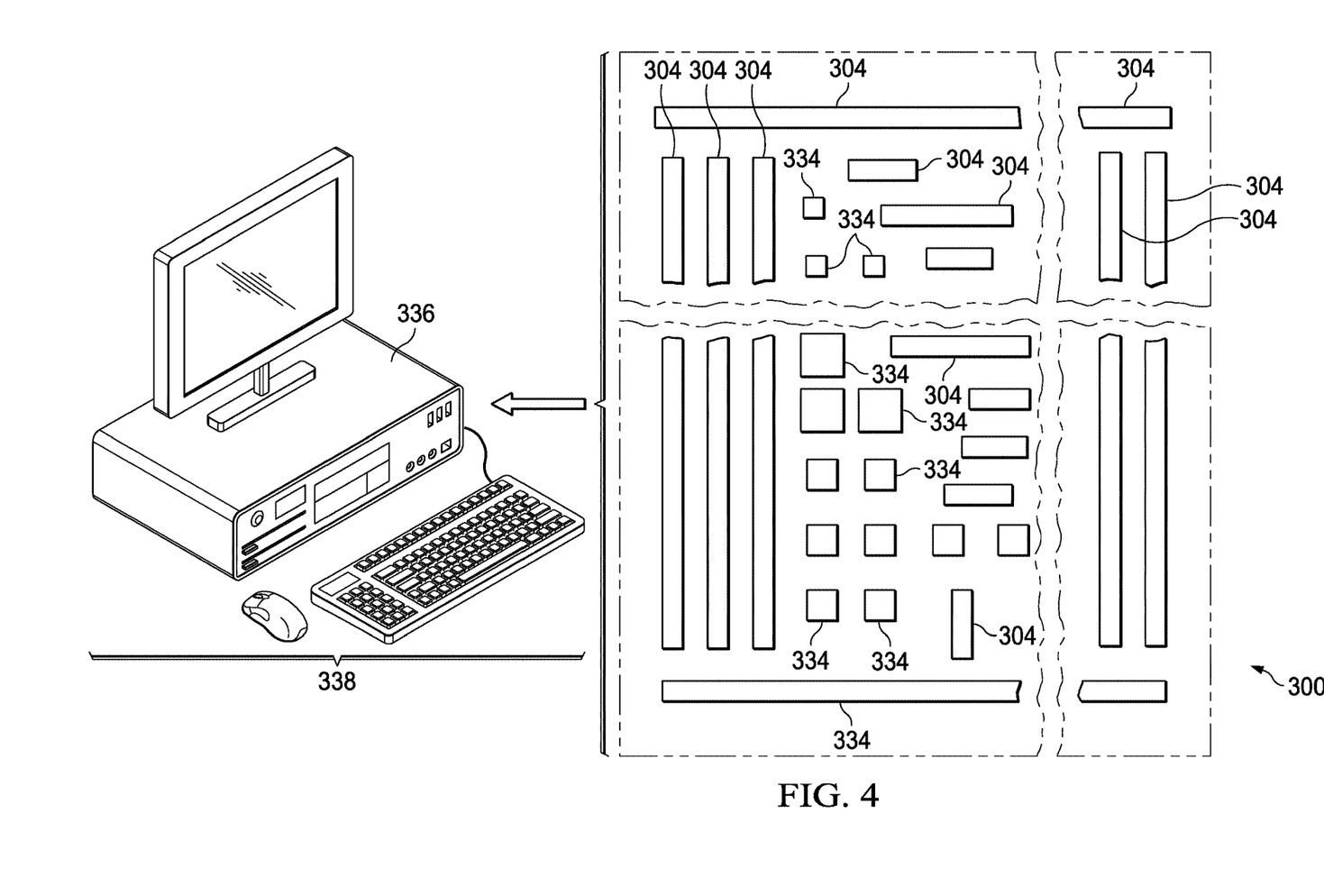
FIG. 4 depicts the layout file being stored in a computer-readable medium.

Referring to FIG. 4, the layout file 300 including the drawn geometries 304 and the variable fill geometries 334 are stored in a computer-readable medium 336. The variable fill geometries 334 include the first plurality of variable fill geometries 324, the second plurality of variable fill geometries 326 and the third plurality of variable fill geometries 328, not shown in FIG. 4, described in reference to FIG. 3. The drawn geometries 304 and the variable fill geometries 334 may be stored as ASCII characters or binary sequences, corresponding to coordinates of vertices, or corresponding to coordinates of reference points and associated lateral dimensions, or other formats. The computer-readable medium 336 may be a memory unit such as a fixed hard disk in a computer 338 used for generating layout files such as the layout file 300. The computer-readable medium 336 may be a removable memory unit such as a removable hard disk, a tape unit or a solid state memory card disposed in the computer 338 for the purpose of storing the layout file 300. The computer-readable medium 336 may be a memory unit connected to a computer network, shared by several computers used for designing layout files. Other manifestations of the computer-readable medium 336 are within the scope of the instant example.

Figure 5:
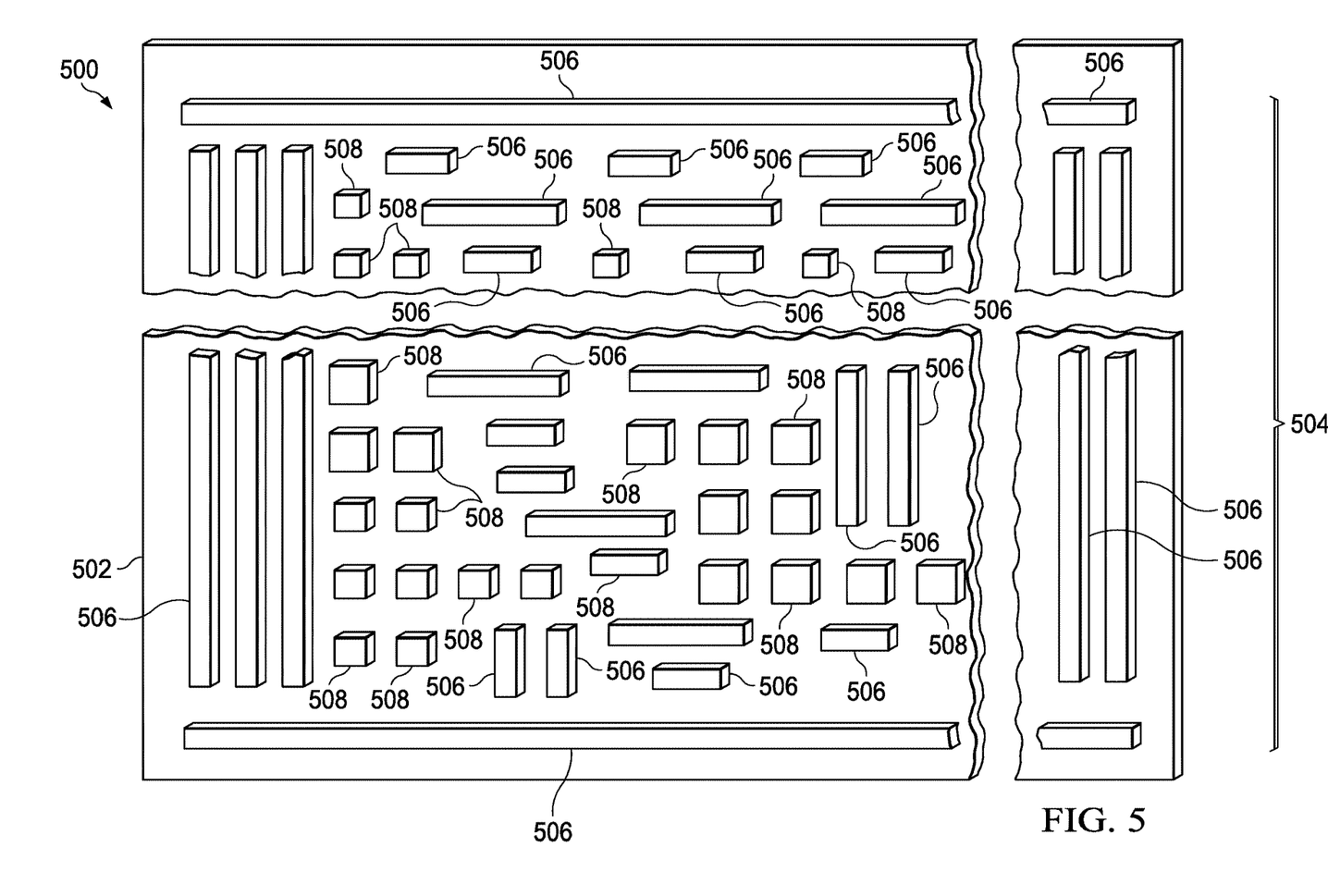
FIG. 5 depicts a photomask formed for formation of the physical layer of the integrated circuit.

Referring to FIG. 5, a photomask 500 may be formed for formation of the physical layer of the integrated circuit. The photomask 500 is formed using the layout file 300 stored in the computer-readable medium 336 of FIG. 4. The photomask 500 includes a substrate 502 which transmits ultraviolet, deep ultraviolet, extreme ultraviolet and/or X-rays, depending on the photolithography process used to form the physical layer. The substrate 502 may include, for example, low thermal expansion glass, quartz, or sapphire. The photomask 500 includes optical elements 504 corresponding to the geometries of the layout file 300. The optical elements 504 include a first plurality of optical elements 506 corresponding to the drawn geometries 304, and a second plurality of optical elements 508 corresponding to the variable fill geometries 334, of FIG. 3. The optical elements 504 may be, for example, optically dense or opaque elements of chromium, as depicted in FIG. 5. Alternatively, the optical elements 504 may be optically transmissive elements surrounded by an optically dense or opaque layer. The optical elements 504 may include phase shift layers. A pellicle, not shown in FIG. 5, may be added to the photomask 500 to protect the optical elements 504.

Figure 6:
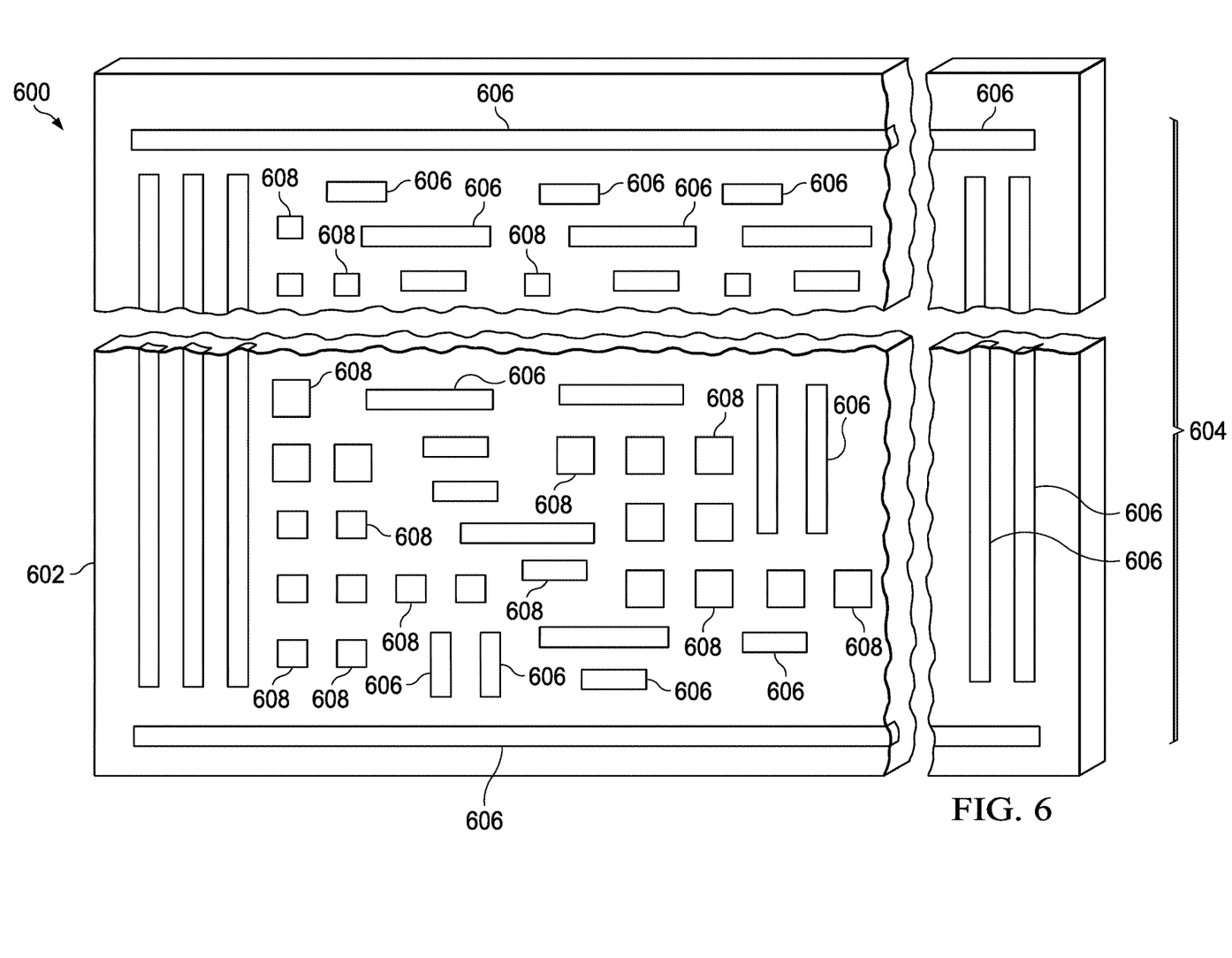
FIG. 6 depicts the integrated circuit during formation, showing the physical layer.

FIG. 6 depicts the integrated circuit during formation, showing the physical layer. The integrated circuit 600 is formed in and on a substrate 602 including a semiconductor material. The substrate 602 may be, for example, a silicon wafer, possibly with an epitaxial layer of silicon at a top surface. Alternately, the substrate 602 may be a silicon-on-insulator (SOI) wafer. The semiconductor material may include silicon, or may include III-V material such as gallium arsenide or gallium nitride. The substrate 602 may include one or more dielectric layers over the semiconductor material. Metal interconnects may be formed in the dielectric layers to provide electrical connections to components in the integrated circuit 600. The physical layer 604 is formed in and/or on the substrate 602. The physical layer 604 may be, for example, metal interconnects formed by a copper damascene process and having a copper damascene structure, or active areas laterally surrounded by field oxide formed by an STI process and having an STI structure. An example copper damascene process includes forming interconnect trenches in a dielectric layer of the substrate 602, forming a metal liner of tantalum nitride in the interconnect trenches and over a top surface of the dielectric layer, forming a layer of copper on the metal liner, and removing the copper and the metal liner from over the top surface of the dielectric layer using a copper CMP process. An example copper damascene structure has the metal interconnects disposed in interconnect trenches in a dielectric layer, the metal interconnects including a metal liner on bottoms and sidewalls of the interconnect trenches and copper on the metal liner in the interconnect trenches. An example STI process includes forming a silicon nitride active area mask over the semiconductor material of the substrate 602, forming isolation trenches in the semiconductor material exposed by the active area mask, forming a layer of thermal oxide on bottoms and sidewalls of the isolation trenches, forming a layer of silicon dioxide-based dielectric material on the layer of thermal oxide in the trenches and over the active area mask, removing the dioxide-based dielectric material from over the active area mask using an oxide CMP process, and removing the active area mask. An example STI structure has the field oxide disposed in isolation trenches with a top surface of the field oxide within 100 nanometers of a top surface of the semiconductor material of the substrate 602. Other physical layers of the integrated circuit 600 are within the scope of the instant example. The physical layer 604 includes a plurality of functional structures 606 corresponding to the drawn geometries 304 of FIG. 3. The plurality of functional structures 606 are directly electrically coupled, possibly through metal interconnects or other electrically conductive structure, to active components such as transistors of the integrated circuit 600. The physical layer 604 also includes a plurality of fill structures 608 corresponding to the variable fill geometries 334 of FIG. 3. The plurality of fill structures 608 are not directly electrically connected to the active components of the integrated circuit 600. The plurality of fill structures 608 have different densities in different regions of the integrated circuit 600. The different densities reflect the different fill densities of the variable fill geometries of the layout file 300. Forming the integrated circuit 600 with the plurality of fill structures 608 may advantageously provide more process latitude for forming the physical layer 604 compared to a comparable integrated circuit with no structures corresponding to variable fill geometries.

Figure 7:
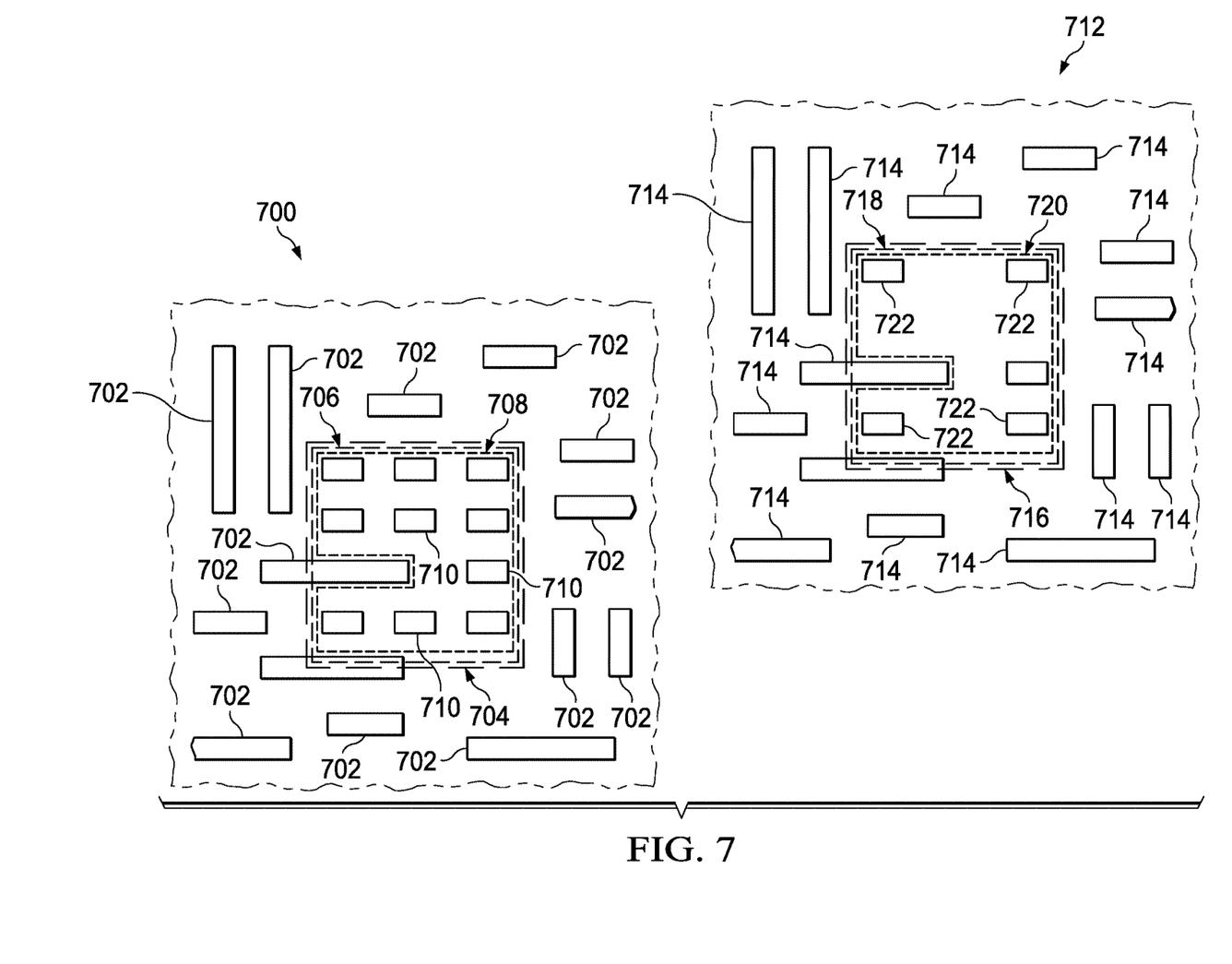
FIG. 7 depicts variable fill geometries in two different layout files for two different integrated circuits.

FIG. 7 depicts variable fill geometries in two different layout files for two different integrated circuits. A first layout file 700 for a first physical layer of a first integrated circuit includes drawn geometries 702. The first physical layer may be, for example, a metal one interconnect layer formed by a copper damascene process. A plurality of windows are defined in an area for the first integrated circuit, including a first window 704. A plurality of local areas are defined in the area for the first integrated circuit, one local area per window, including a first local area 706 for the first window 704. In the instant example, the first window 704 is coincident with the first local area 706; FIG. 7 shows the first window 704 slightly larger than the first local area 706 to depict their separate boundaries, even though the boundaries are coincident. A first fill portion 708 of the first local area 706 is defined as a portion of the first local area 706 that is free of the drawn geometries 702 and is available for fill geometries, consistent with design rules for the physical layer of the first integrated circuit. A first global density for the physical layer of the first integrated circuit is an area of the drawn geometries 702 for the physical layer divided by an area of the first integrated circuit. The first global density is less than a target density for the physical layer. A first local density is computed as an area of the drawn geometries 702 within the first window 704 divided by an area of the first window 704. The first local density is less than the target density. A first plurality of variable fill geometries 710 is generated for the first fill portion 708. The first plurality of variable fill geometries 710 have a first fill density which is a function of the first local density, the first global density, and the target density. In the instant example, the first plurality of variable fill geometries 710 have rectangular shapes. Other shapes for the first plurality of variable fill geometries 710 are within the scope of the instant example.

A second layout file 712 for a second physical layer of a second integrated circuit includes drawn geometries 714. The second physical layer provides the same function for the second integrated circuit that the first physical layer provides for the first integrated circuit. For example, in the case that the first physical layer is a metal one interconnect layer formed by a copper damascene process, as mentioned above, the second physical layer is also a metal one interconnect layer formed by a copper damascene process. The target density for the second physical layer of the second integrated circuit is the same target density for the first physical layer of the first integrated circuit. The second integrated circuit has a different design than the first integrated circuit. The instant example may occur, for example, when the first integrated circuit and the second integrated circuit are designed using a same set of design rules and formed in a same fabrication facility using a same process sequence. A second global density for the physical layer of the second integrated circuit is an area of the drawn geometries 714 for the physical layer divided by an area of the second integrated circuit. The second global density is less than the target density for the physical layer. In the instant example, the second global density is greater than the first global density. A plurality of windows are defined in an area for the second integrated circuit, including a second window 716. In the instant example, the second window 716 is the same size and shape as the first window 704, and a configuration of the drawn geometries 714 in the second window 716 is the same as a configuration of the drawn geometries 702 in the first window 704, so that a second local density, computed as an area of the drawn geometries 714 within the second window 716 divided by an area of the second window 716, is the same as the first local density. The first window 704 and the second window 716 may be located in similar circuits of the first integrated circuit and the second integrated circuit, respectively. A plurality of local areas are defined in the area for the second integrated circuit, one local area per window, including a second local area 718 for the second window 716. In the instant example, the second window 716 is coincident with the second local area 718; FIG. 7 shows the second window 716 slightly larger than the second local area 718 to depict their separate boundaries, even though the boundaries are coincident. A second fill portion 720 of the second local area 718 is defined as a portion of the second local area 718 that is free of the drawn geometries 714 and is available for fill geometries, consistent with design rules for the physical layer of the second integrated circuit. A configuration of the drawn geometries 714 in the second local area 718 is the same as a configuration of the drawn geometries 702 in the first local area 706, so that the second fill portion 720 has a same size and shape as the first fill portion 708. A second plurality of variable fill geometries 722 is generated for the second fill portion 720. In the instant example, the second plurality of variable fill geometries 722 have the same rectangular shapes and size as the first plurality of variable fill geometries 710; the second plurality of variable fill geometries 722 are separated from each other by larger distances than the first plurality of variable fill geometries 710. Other shapes for the second plurality of variable fill geometries 722, including shapes different from the first plurality of variable fill geometries 710, are within the scope of the instant example. The second plurality of variable fill geometries 722 have a second fill density which is a function of the second local density, the second global density, and the target density. In the instant example, the second fill density is less than the first fill density because the second global density is higher than the first global density, even though the second local density is the same as the first local density, which may advantageously provide more process latitude for forming the first physical layer of the first integrated circuit and the second physical layer of the second integrated circuit, compared to generating substantially equal fill densities in both the first fill portion and the second fill portion.

The first layout file 700 is stored in a first computer-readable medium, for example as described in reference to FIG. 4. The second layout file 712 is stored in a second computer-readable medium, which may possibly be the first computer-readable medium. The first integrated circuit is formed using the first layout file 700, and the second integrated circuit is formed using the second layout file 712, for example as described in reference to FIG. 5 and FIG. 6. The first physical layer of the first integrated circuit includes a first plurality of structures corresponding to the drawn geometries 702 of the first layout file 700, and a second plurality of structures corresponding to the variable fill geometries 710 of the first layout file 700. Similarly, the second physical layer of the second integrated circuit includes a third plurality of structures corresponding to the drawn geometries 714 of the second layout file 712, and a fourth plurality of structures corresponding to the variable fill geometries 722 of the second layout file 712.

Figure 8:
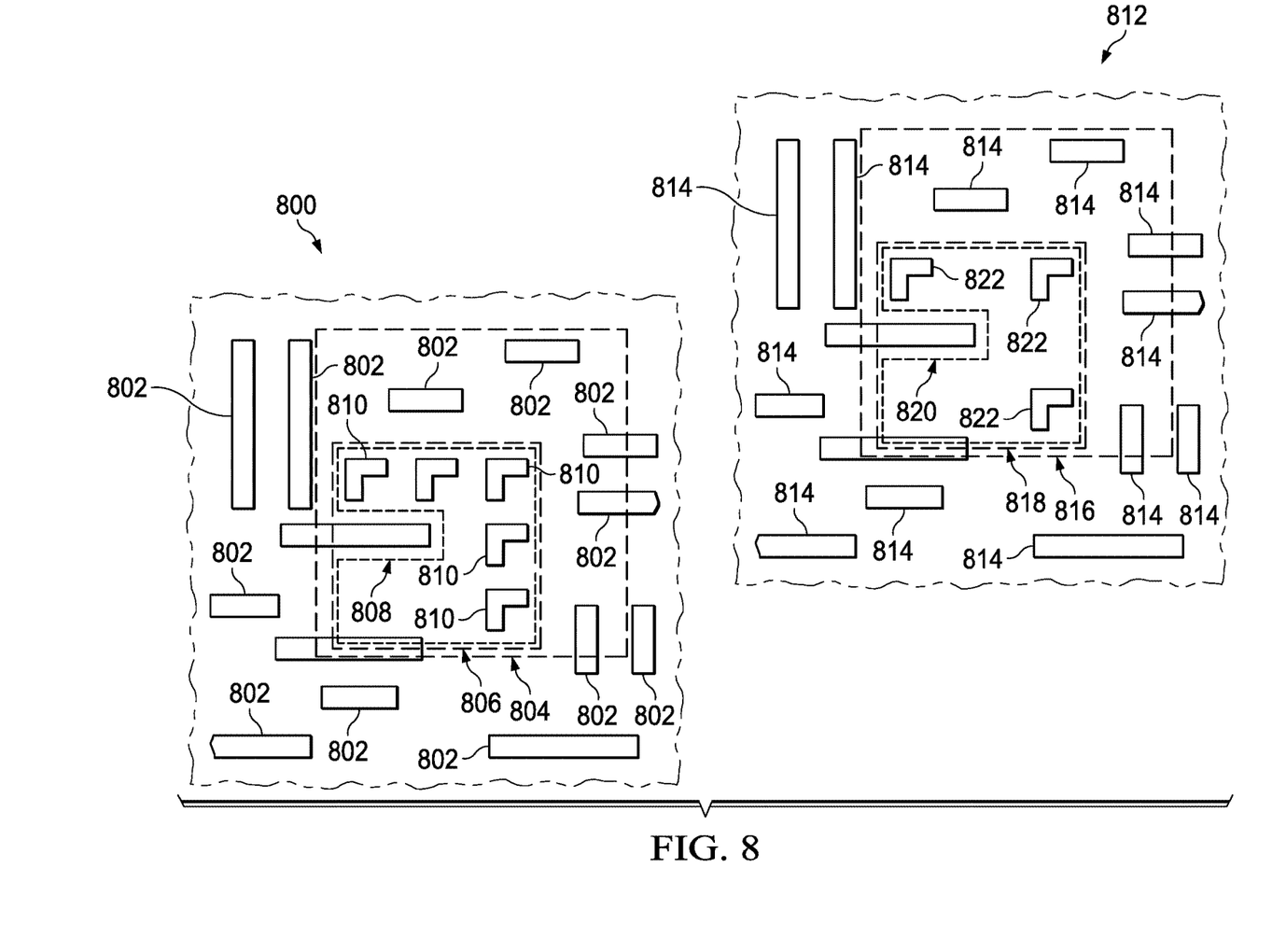
FIG. 8 depicts variable fill geometries in two different layout files for two different integrated circuits.

FIG. 8 depicts variable fill geometries in two different layout files for two different integrated circuits. A first layout file 800 for a first physical layer of a first integrated circuit includes drawn geometries 802. The first physical layer may be, for example, an active area layer with field oxide formed by an STI process. A plurality of windows are defined in an area for the first integrated circuit, including a first window 804. A plurality of local areas are defined in the area for the first integrated circuit, one local area per window, including a first local area 806 for the first window 804. In the instant example, the first window 804 is larger than the first local area 806, and the first local area 806 is not centered in the first window 804. A first fill portion 808 of the first local area 806 is defined as a portion of the first local area 806 that is free of the drawn geometries 802 and is available for fill geometries, consistent with design rules for the physical layer of the first integrated circuit. A first global density for the physical layer of the first integrated circuit is an area of the drawn geometries 802 for the physical layer divided by an area of the first integrated circuit. The first global density is less than a first target density for the physical layer. A first local density is computed as an area of the drawn geometries 802 within the first window 804 divided by an area of the first window 804. The first local density is less than the first target density. A first plurality of variable fill geometries 810 is generated for the first fill portion 808. In the instant example, the first plurality of variable fill geometries 810 have chevron shapes, other shapes for the first plurality of variable fill geometries 810 are within the scope of the instant example. The first plurality of variable fill geometries 810 have a first fill density which is a function of the first local density, the first global density, and the first target density. In the instant example, the variable fill geometries 810 are added to the first fill portion 808 until the first fill density is attained, a region of the first fill portion 808 is free of the variable fill geometries 810.

A second layout file 812 for a second physical layer of a second integrated circuit includes drawn geometries 814. The second physical layer provides the same function for the second integrated circuit that the first physical layer provides for the first integrated circuit. For example, in the case that the first physical layer is an active area layer with field oxide formed by an STI process, as mentioned above, the second physical layer is also an active area layer with field oxide formed by an STI process. The second integrated circuit has the same design as the first integrated circuit, so that the drawn geometries 814 are substantially the same as the drawn geometries 702 of the first layout file. A second target density for the second physical layer of the second integrated circuit is lower than the first target density for the first physical layer of the first integrated circuit. The instant example may occur, for example, when the first integrated circuit and the second integrated circuit are formed using different process tools for the first physical layer and the second physical layer. For example, the first physical layer may be formed using a first oxide CMP tool optimized for the first target density, and the second physical layer may be formed using a second oxide CMP tool optimized for the second target density. A second global density for the physical layer of the second integrated circuit is an area of the drawn geometries 814 for the physical layer divided by an area of the second integrated circuit. In the instant example, the second global density is equal to the first global density. The second global density is less than the second target density for the physical layer. A plurality of windows are defined in an area for the second integrated circuit, including a second window 816. In the instant example, the second window 816 is the same size and shape as the first window 804, and is located at a same position as the first window 804, so that a configuration of the drawn geometries 814 in the second window 816 is the same as a configuration of the drawn geometries 802 in the first window 804, and so that a second local density, computed as an area of the drawn geometries 814 within the second window 816 divided by an area of the second window 816, is the same as the first local density. A plurality of local areas are defined in the area for the second integrated circuit, one local area per window, including a second local area 818 for the second window 816. In the instant example, the second local area 818 has the same spatial relationship to the second window 816 that the first local area 806 has to the first window 806. A second fill portion 820 of the second local area 818 is defined as a portion of the second local area 818 that is free of the drawn geometries 814 and is available for fill geometries, consistent with design rules for the physical layer of the second integrated circuit. A configuration of the drawn geometries 814 in the second local area 818 is the same as a configuration of the drawn geometries 802 in the first local area 806, so that the second fill portion 820 has a same size and shape as the first fill portion 808. A second plurality of variable fill geometries 822 is generated for the second fill portion 820. In the instant example, the second plurality of variable fill geometries 822 have chevron shapes similar to the first plurality of variable fill geometries 810. The second plurality of variable fill geometries 822 have a second fill density which is a function of the second local density, the second global density, and the second target density. In the instant example, the variable fill geometries 822 are added to the second fill portion 820 until the second fill density is attained, a region of the second fill portion 820 is free of the variable fill geometries 822. In the instant example, the second fill density is less than the first fill density because the second target density is lower than the first target density, even though the second local density is the same as the first local density and the second global density is the same as the first global density, which may advantageously provide more process latitude for forming the first physical layer of the first integrated circuit and the second physical layer of the second integrated circuit, compared to generating substantially equal fill densities in both the first fill portion and the second fill portion.

The first layout file 800 is stored in a first computer-readable medium, for example as described in reference to FIG. 4. The second layout file 812 is stored in a second computer-readable medium, possibly the first computer-readable medium. The first integrated circuit is formed using the first layout file 800, and the second integrated circuit is formed using the second layout file 812, for example as described in reference to FIG. 5 and FIG. 6. The first physical layer of the first integrated circuit includes a first plurality of structures corresponding to the drawn geometries 802 of the first layout file 800, and a second plurality of structures corresponding to the variable fill geometries 810 of the first layout file 800. Similarly, the second physical layer of the second integrated circuit includes a third plurality of structures corresponding to the drawn geometries 814 of the second layout file 812, and a fourth plurality of structures corresponding to the variable fill geometries 822 of the second layout file 812.

While various examples of the present disclosure have been described above, it should be understood that they have been presented by way of example only and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the following claims and their equivalents.

What is claimed is:

1. An integrated circuit, comprising:
   functional structures of a physical layer of the integrated circuit; and
   a plurality of fill structures of the physical layer, each fill structure being conductively isolated from the functional structures and others of the fill structures, the fill structures including:
      first fill structures having a first size, located in a first region having a first region area and a first fill density, the first fill density defined by a ratio of a first fill area divided by the first region area, the first fill area being an area occupied by the first fill structures in the first region; and
      second fill structures having a second size, located in a second region different from the first region, the second region having a second region area and a second fill density, the second fill density defined by a ratio of a second fill area divided by the second region area, the second fill area being an area occupied by the second fill structures in the second region, wherein the first size is different from the second size, or the first fill density is different from the second fill density.

2. The integrated circuit of claim 1, wherein the first size of the first fill structures is equal to the second size of the second fill structures.

3. The integrated circuit of claim 1, wherein the first fill density is equal to the second fill density.

4. The integrated circuit of claim 1, wherein the first fill structures and the second fill structures have a same first pitch distance along a first axis of the integrated circuit and have a same second pitch distance along a second orthogonal axis of the integrated circuit.

5. The integrated circuit of claim 1, further comprising third fill structures having a third size, located in a third region different from the first region and the second region, the third region having a third region area and a third fill density defined by a ratio of a third fill area divided by the third region area, the third fill area being an area occupied by the third fill structures in the third region, wherein the third size is different from the first size and the second size, or the third fill density is different from the first fill density and the second fill density.

6. The integrated circuit of claim 1, wherein the functional structures include metal interconnects, and the functional structures and the fill structures both include a copper damascene structure.

7. The integrated circuit of claim 1, wherein the functional structures and the fill structures each include semiconductor material laterally surrounded by field oxide having a shallow trench isolation (STI) structure.

8. The integrated circuit of claim 1, wherein the first and second fill structures have a square shape, a rectangular shape or a chevron shape.

9. The integrated circuit of claim 1, further comprising a plurality of transistors formed in or over a semiconductor substrate, the plurality of transistors including a structural element at a same material level as the plurality of fill structures, or the plurality of transistors being connected to interconnects at a same material level as the plurality of fill structures.

10. The integrated circuit of claim 9, wherein the semiconductor substrate comprises silicon.

11. A method of forming an integrated circuit, comprising:
providing a mask including mask elements, the mask elements including first mask elements corresponding to functional structures of a physical layer of the integrated circuit, and second mask elements corresponding to fill structures of the physical layer, each second mask element being unconnected to neighboring mask elements, the second mask elements including:
a first subset of mask elements corresponding to first fill structures having a first size, located in a first region having a first region area and a first fill density, the first fill density defined by a ratio of a first fill area divided by the first region area, the first fill area being an area occupied by the first fill structures in the first region; and
a second subset of mask elements corresponding to second fill structures having a second size, located in a second region different from the first region, the second region having a second region area and a second fill density, the second fill density defined by a ratio of a second fill area divided by the second region area, the second fill area being an area occupied by the second fill structures in the second region,
wherein the first size is different from the second size, or the first fill density is different from the second fill density; and
patterning the physical layer of the integrated circuit using the mask.

12. The method of claim 11, wherein the first size of the first fill structures is equal to the second size of the second fill structures.

13. The method of claim 11, wherein the first fill density is equal to the second fill density.

14. The method of claim 11, wherein the first fill structures and the second fill structures have a same first pitch distance along a first axis of the integrated circuit and have a same second pitch distance along a second orthogonal axis of the integrated circuit.

15. The method of claim 11, further comprising third mask elements corresponding to third fill structures having a third size, located in a third region different from the first region and the second region, the third region having a third region area and a third fill density defined by a ratio of a third fill area divided by the third region area, the third fill area being an area occupied by the third fill structures in the third region, wherein the third size is different from the first size and the second size, or the third fill density is different from the first fill density and the second fill density.

16. The method of claim 11, wherein the first mask elements correspond to copper damascene interconnects of the integrated circuit.

17. The method of claim 11, wherein the first mask elements correspond to active regions of the integrated circuit.

18. The method of claim 11, wherein the first subset of mask elements and the second subset of mask elements correspond to fill structures having a square shape, a rectangular shape or a chevron shape.

19. The method of claim 11, wherein the mask elements are implemented as optically dense or opaque elements.

20. The method of claim 11, wherein the mask elements include a phase shift layer.

* * * * *